US012808084B2

(12) United States Patent
Kobayashi et al.

(10) Patent No.: US 12,808,084 B2
(45) Date of Patent: Nov. 24, 2026

(54) ALN SINGLE CRYSTAL SUBSTRATE AND DEVICE

(71) Applicant: NGK INSULATORS, LTD., Nagoya (JP)

(72) Inventors: Hiroharu Kobayashi, Kasugai (JP); Hirohisa Ogawa, Kitanagoya (JP); Morimichi Watanabe, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 294 days.

(21) Appl. No.: 18/779,382

(22) Filed: Jul. 22, 2024

(65) Prior Publication Data

US 2024/0376635 A1 Nov. 14, 2024

Related U.S. Application Data

(63) Continuation of application No. PCT/JP2022/013982, filed on Mar. 24, 2022.

(51) Int. Cl.
*C30B 29/40* (2006.01)
*H10D 62/85* (2025.01)

(52) U.S. Cl.
CPC ....... *C30B 29/403* (2013.01); *H10D 62/8503* (2025.01)

(58) Field of Classification Search
CPC ....... C30B 29/403; C30B 23/02; C30B 29/38; H10D 62/8503
See application file for complete search history.

(56) References Cited

U.S. PATENT DOCUMENTS

| | | | |
|---|---|---|---|
| 7,332,027 B2 | 2/2008 | Kobayashi et al. | |
| 8,323,402 B2 | 12/2012 | Tanizaki et al. | |
| 8,641,821 B2 | 2/2014 | Katou et al. | |
| 11,555,256 B2 * | 1/2023 | Bondokov | C30B 23/00 |

(Continued)

FOREIGN PATENT DOCUMENTS

| | | |
|---|---|---|
| JP | 200627988 A | 2/2006 |
| JP | 200645047 A | 2/2006 |

(Continued)

OTHER PUBLICATIONS

International Search Report, with English translation, issued in corresponding International Application No. PCT/JP2022/013982, date of mailing May 17, 2022 (7 pages).

(Continued)

*Primary Examiner* — Victor A Mandala
(74) *Attorney, Agent, or Firm* — FLYNN THIEL, P.C.

(57) ABSTRACT

There is provided an AlN single-crystal substrate satisfying a relation: $5\leq[(\lambda_{25}-\lambda_{200})\times\log_{10}\rho]/(T_{640-660}-T_{260-280})\leq 50$, wherein $\lambda_{25}$ is a thermal conductivity (W/m·K) at 25° C. of the AlN single-crystal substrate; $\lambda_{200}$ is a thermal conductivity (W/m·K) at 200° C. of the AlN single-crystal substrate; ρ is an electrical resistivity (Ω·cm) at 25° C. of the AlN single-crystal substrate; $T_{640-660}$ is an average value of transmittance (%) at 640 to 660 nm in a transmission spectrum of the AlN single-crystal substrate; and $T_{260-280}$ is an average value of transmittance (%) at 260 to 280 nm in the transmission spectrum.

6 Claims, 1 Drawing Sheet

(56) References Cited

U.S. PATENT DOCUMENTS

| | | | | |
|---|---|---|---|---|
| 11,840,773 B1* | 12/2023 | Bondokov | C30B 15/00 | |
| 2011/0094438 A1* | 4/2011 | Koukitu | C30B 25/183 | 117/3 |
| 2013/0019927 A1* | 1/2013 | Zimmerman | C30B 19/12 | 428/688 |
| 2022/0372651 A1* | 11/2022 | Clarke | C30B 25/183 | |
| 2023/0257905 A1* | 8/2023 | Kubota | C23C 16/345 | 428/76 |
| 2024/0141552 A1* | 5/2024 | Kubota | C23C 16/301 | |
| 2024/0401236 A1* | 12/2024 | Kobayashi | C30B 29/38 | |

FOREIGN PATENT DOCUMENTS

| | | |
|---|---|---|
| JP | 2009190965 A | 8/2009 |
| WO | 2010122801 A1 | 10/2010 |
| WO | 2015108089 A1 | 7/2015 |

OTHER PUBLICATIONS

Written Opinion of International Searching Authority, with English translation, issued in corresponding International Application No. PCT/JP2022/013982, date of mailing May 17, 2022 (6 pages).

A.V. Inyushkin et al., On the thermal conductivity of single crystal AlN, Journal of Applied Physics, vol. 127, No. 20, pp. 205109-1 to 205109-6, May 2020 (7 pages).

Iurii Kogut et al., Electromechanical losses in carbon- and oxygen-containing bulk AlN single crystals, Solid State Ionics, vol. 343, pp. 1-10, 2019 (10 pages).

Toru Nagashima et al., Homoepitaxial growth of AlN on a 2-in diameter AlN single crystal substrate by hydride vapor phase epitaxy, Journal of Crystal Growth, vol. 540, pp. 1-5, 2020 (5 pages).

* cited by examiner

ALN SINGLE CRYSTAL SUBSTRATE AND DEVICE

CROSS-REFERENCE TO RELATED APPLICATION

This application is a continuation application of PCT/JP2022/013982 filed Mar. 24, 2022, the entire contents of which are incorporated herein by reference.

BACKGROUND OF THE INVENTION

1. Field of the Invention

The present invention relates to an AlN single-crystal substrate and a device comprising the AlN single-crystal substrate.

2. Description of the Related Art

Aluminum nitride (AlN) single crystals have recently attracted attention as base substrates for deep ultraviolet light emitting elements using AlN-based semiconductors. For example, AlN, AlGaN, and the like are used as AlN-based semiconductors. These AlN-based semiconductors have a direct band gap structure, which makes them suitable for light-emitting devices and applicable to light emitting diodes (LEDs) and laser diodes (LDs) in the deep ultraviolet region.

For example, Patent Literature 1 (WO2015/108089A1) discloses an ultraviolet light-emitting diode having a stacked structure in which a substrate with a light-emitting main surface from which light is emitted, an n-type layer, an active layer, and a p-type layer are stacked in this order. This literature discloses that when fabricating an ultraviolet light source such as an ultraviolet light-emitting diode, an AlN single crystal used as the substrate with a light-emitting main surface is required to have high ultraviolet transmittance. Patent Literature 2 (JP2009-190965A) discloses a method for growing an AlN crystal comprising the steps of providing a stacked substrate having a layer structure of a base substrate/a first layer/a second layer; and growing an AlN crystal on a main surface of the base substrate using a vapor phase growth method, wherein the first layer is made of a material that is less likely to sublimate than the base substrate at a growth temperature of the AlN crystal, and wherein the second layer is made of a material with a thermal conductivity higher than a thermal conductivity of the first layer. This literature discloses that AlN crystals have attracted attention as substrate materials for semiconductor devices, such as optical and electronic devices, because of their high thermal conductivity and high electrical resistance.

CITATION LIST

Patent Literature

Patent Literature 1: WO2015/108089A1
Patent Literature 2: JP2009-190965A

SUMMARY OF THE INVENTION

As described above, AlN single crystals have attracted attention for various applications. However, AlN single-crystal substrates as disclosed in Patent Literatures 1 and 2 have the drawback of being likely to crack when processed (such as ground, polished, or cut), resulting in a reduced yield. Therefore, it is desirable to reduce cracking of AlN single-crystal substrates during processing of the AlN single-crystal substrates.

The prevent inventors have now found that when an AlN single-crystal substrate satisfies a specific relation concerning (ultraviolet and visible) transmittances, thermal conductivities, and electrical resistivity, the AlN single-crystal substrate is less likely to crack when processed (such as ground, polished, or cut).

Therefore, it is an object of the present invention to provide an AlN single-crystal substrate that is less likely to crack when processed (such as ground, polished, or cut).

According to an aspect of the present invention, there is provided an AlN single-crystal substrate, which satisfies a relation:

$$5 \leq [(\lambda_{25}-\lambda_{200})\times\log_{10}\rho]/(T_{640\text{-}660}-T_{260\text{-}280}) \leq 50$$

wherein $\lambda_{25}$ is a thermal conductivity (W/m·K) at 25° C. of the AlN single-crystal substrate; $\lambda_{200}$ is a thermal conductivity (W/m·K) at 200° C. of the AlN single-crystal substrate; $\rho$ is an electrical resistivity (Ω·cm) at 25° C. of the AlN single-crystal substrate; $T_{640\text{-}660}$ is an average value of transmittance (%) at 640 to 660 nm in a transmission spectrum of the AlN single-crystal substrate; and $T_{260\text{-}280}$ is an average value of transmittance (%) at 260 to 280 nm in the transmission spectrum.

According to another aspect of the present invention, there is provided a device comprising the AlN single-crystal substrate.

DETAILED DESCRIPTION OF THE INVENTION

AlN Single-Crystal Substrate

Figure 1:
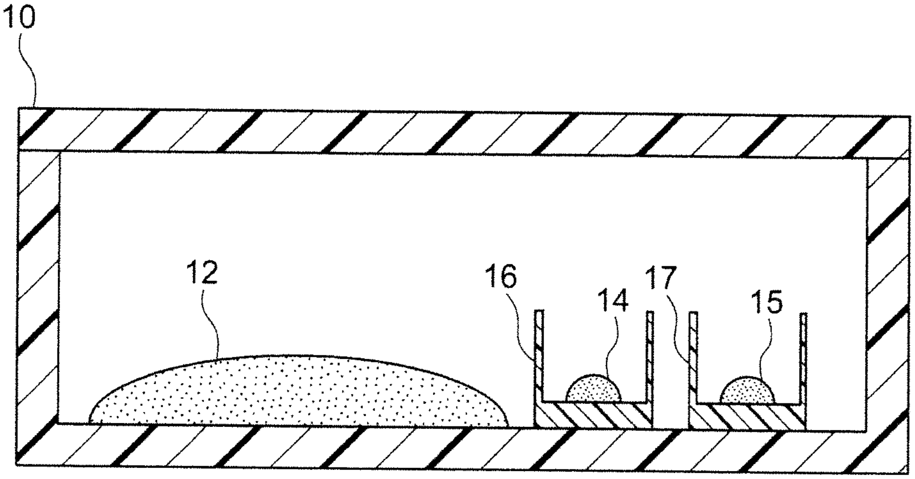
FIG. 1 is a schematic cross-sectional view showing the structure of a heat treatment apparatus used to prepare AlN raw material powder.

An AlN single-crystal substrate according to the present invention satisfies a relation concerning transmittances, thermal conductivities, and electrical resistivity: $5 \leq [(\lambda_{25}-\lambda_{200})\times\log_{10}\rho]/(T_{640\text{-}660}-T_{260\text{-}280}) \leq 50$. In the inequation, $\lambda_{25}$ is a thermal conductivity (W/m·K) at 25° C. of the AlN single-crystal substrate; and $\lambda_{200}$ is a thermal conductivity (W/m·K) at 200° C. of the AlN single-crystal substrate. $\rho$ is an electrical resistivity (Ω·cm) at 25° C. of the AlN single-crystal substrate. $T_{640\text{-}660}$ is an average value of transmittance (%) at 640 to 660 nm in a transmission spectrum of the AlN single-crystal substrate; and $T_{260\text{-}280}$ is an average value of transmittance (%) at 260 to 280 nm in the transmission spectrum. When the AlN single-crystal substrate thus satisfies the predetermined relation concerning (ultraviolet and visible) transmittances, thermal conductivities, and electrical resistivity, the AlN single-crystal substrate is less likely to crack when processed (such as ground, polished, or cut). Therefore, by subjecting such an AlN single-crystal substrate to processing, the AlN single-crystal substrate can be manufactured at a high yield. That is, as described above, the conventional AlN single-crystal substrates have the drawback of being likely to crack when processed (such as ground, polished, or cut), resulting in a reduced yield. In this respect, the AlN single-crystal substrate of the present invention can advantageously overcome the aforementioned drawback.

As used herein, "average value of transmittance" in a specific wavelength range in the transmission spectrum is determined by dividing a sum of transmittances (%) at the wavelengths (nm) measured in the specific wavelength range (for example, from 260 to 280 nm or from 640 to 660 nm), by the number of measurement points. For example, when a sum of transmittances measured in 1 nm increments in the region from 640 to 660 nm is 1050, the average value of transmittance can be obtained by dividing the sum of transmittances by the number of measurement points, i.e., 21 (for example, 1050/21=50%). The transmittance in this case is preferably the transmittance $T_{100\ \mu m}$ with the thickness of the AlN single-crystal substrate converted to 100 μm. This is because if there is a variation in the thickness of the AlN single-crystal substrate to be measured, the transmittance also changes accordingly. For example, the transmittance decreases with increasing thickness of the AlN single-crystal substrate and increases with decreasing thickness of the AlN single-crystal substrate.

The transmittance in the transmission spectrum can be determined by, for example, the below-described calculation method. The total light transmittance $T_a$ of the AlN single-crystal substrate is measured using a spectrophotometer. The absorption coefficient α of the AlN single-crystal substrate is determined using the measured value of $T_a$ and theoretical transmittance $T_t$ of the AlN single-crystal substrate. Then, the transmittance $T_{100\ \mu m}$ with the thickness of the AlN single-crystal substrate converted to 100 μm is calculated. Here, α and $T_{100\ \mu m}$ can be determined according to the following equations:

$$\alpha = -1/t \times \ln(T_a/T_t);\text{ and}$$

$$T_{100\,\mu m} = \exp(-\alpha/100)$$

wherein t represents an actual thickness (cm) of an AlN single-crystal sample. For an AlN single-crystal sample that has low transmittance and for which the absorption coefficient α is difficult to calculate, the actual thickness may be reduced, and the total light transmittance $T_a$ may be measured. In this manner, a transmission spectrum based on the transmittance $T_{100\ \mu m}$ with the thickness converted to 100 μm is obtained.

In the transmission spectrum of the AlN single-crystal substrate, a difference between the average value of transmittance at 640 to 660 nm ($T_{640\text{-}660}$) and the average value of transmittance at 260 to 280 nm ($T_{260\text{-}280}$) ($T_{640\text{-}660}-T_{260\text{-}280}$) is preferably 10 to 80 percent points (% pt), more preferably 20 to 75% pt, and still more preferably 30 to 70% pt.

In the AlN single-crystal substrate, a difference between the thermal conductivity ($\lambda_{25}$) at 25° C. and the thermal conductivity ($\lambda_{200}$) at 200° C. ($\lambda_{25}-\lambda_{200}$) is preferably 60 to 90 W/m·K, more preferably 65 to 85 W/m·K, and still more preferably 70 to 80 W/m·K.

The AlN single-crystal substrate preferably has an electrical resistivity ρ at 25° C. of $1\times10^3$ to $1\times10^{17}$ Ω·cm, more preferably $5\times10^3$ to $1\times10^{11}$ Ω·cm, and still more preferably $1\times10^4$ to $1\times10^6$ Ω·cm.

As described above, the AlN single-crystal substrate satisfies the relation: $5\leq[(\lambda_{25}-\lambda_{200})\times\log_{10}\rho]/(T_{640\text{-}660}-T_{260\text{-}280})\leq50$; preferably $5\leq[(\lambda_{25}-\lambda_{200})\times\log_{10}\rho]/(T_{640\text{-}660}-T_{260\text{-}280})\leq35$; and more preferably $5\leq[(\lambda_{25}-\lambda_{200})\times\log_{10}\rho]/(T_{640\text{-}660}-T_{260\text{-}280})\leq50$. When the AlN single-crystal substrate satisfies such relations, it is less likely to crack when processed (such as ground, polished, or cut). Moreover, by subjecting such an AlN single-crystal substrate to processing, the AlN single-crystal substrate can be manufactured at a higher yield.

The AlN single-crystal substrate according to the present invention is preferably an oriented layer that is oriented in both the c- and a-axis directions, and may contain a mosaic crystal. The mosaic crystal refers to a crystal that does not have distinct grain boundaries but is an aggregation of crystals whose crystal orientation slightly deviates from one or both of the c- and a-axes. Such an oriented layer has a structure in which the crystal orientation is substantially aligned with a substantially normal direction (c-axis direction) and an in-plane direction (a-axis direction). Such a structure allows a semiconductor layer with an excellent quality, particularly an excellent orientation, to be formed on the oriented layer. That is, when forming a semiconductor layer on the oriented layer, the crystal orientation of the semiconductor layer substantially matches the crystal orientation of the oriented layer. Therefore, a semiconductor film formed on the AlN single-crystal substrate tends to be an oriented film.

Methods of evaluating the orientation in the AlN single-crystal substrate according to the present invention include, but are not specifically limited to, known analytical techniques such as the EBSD (Electron Back Scatter Diffraction Patterns) method and X-ray pole figures. For example, when using the EBSD method, an inverse pole figure map and a crystal orientation map of a surface (plate surface) or a cross section orthogonal to the plate surface of the AlN single-crystal substrate are measured. The AlN single-crystal substrate can be defined as being oriented along the two axes in the substantially normal direction and a substantially plate-surface direction, when the following conditions are satisfied: in the obtained inverse pole figure map, (A) the crystals are oriented in a specific orientation (first axis) in the substantially normal direction with respect to the plate surface, and (B) the crystals are oriented in a specific orientation (second axis) in the substantially in-plane plate-surface direction, orthogonal to the first axis; and in the obtained crystal orientation map, (C) the inclination angle from the first axis is distributed within ±10°, and (D) the inclination angle from the second axis is distributed within ±10°. In other words, when the above-described four conditions are satisfied, the AlN single-crystal substrate can be determined as being oriented along the two axes, i.e., the c- and a-axes. For example, when the substantially normal direction with respect to the plate surface is oriented along the c-axis, the substantially in-plane plate-surface direction may be oriented in a specific orientation (for example, the a-axis) orthogonal to the c-axis. While the AlN single-crystal substrate may be oriented along the two axes in the substantially normal direction and the substantially in-plane plate-surface direction, it is preferred that the substantially normal direction is oriented along the c-axis. The smaller the inclination angle distribution in the substantially normal direction and/or the substantially in-plane plate-surface direction, the smaller the mosaicity of the AlN single-crystal substrate; and the closer the inclination angle distribution is to zero, the closer the AlN single-crystal substrate is to a perfect single crystal. Therefore, from the viewpoint of crystallinity of the AlN single-crystal substrate, the inclination angle distribution is preferably smaller in both the substantially normal direction and the substantially plate-surface direction, and is preferably within ±5° or less, and more preferably within ±3° or less, for example.

One surface of the AlN single-crystal substrate preferably has an area of 20 $cm^2$ or more, more preferably 70 $cm^2$ or more, and still more preferably 170 $cm^2$ or more. By thus increasing the area of the AlN single-crystal substrate, it is possible to increase the area of the semiconductor layer to be formed thereon. Therefore, it is possible to obtain a larger number of semiconductor elements from a single semiconductor layer, and a reduction in manufacturing costs can be expected. While the upper limit of size is not specifically limited, the area of the one surface is typically 710 $cm^2$ or less.

Method of Manufacture

The AlN single-crystal substrate of the present invention can be manufactured by various methods as long as the above-described relation concerning transmittances, thermal conductivities, and electrical resistivity is satisfied. A seed substrate may be provided and then an epitaxial film may be formed thereon, or the AlN single-crystal substrate may be directly manufactured by spontaneous nucleation without using a seed substrate. The seed substrate to be used may be an AlN substrate to achieve homoepitaxial growth, or may be a substrate other than the AlN substrate to achieve heteroepitaxial growth. While any of a vapor phase deposition method, a liquid phase deposition method, and a solid phase deposition method may be used to grow a single crystal, the vapor phase deposition method is preferably used to form an AlN single crystal, and then the seed substrate portion is ground away, as required, to obtain a desired AlN single-crystal substrate. Examples of the vapor phase deposition method include various CVD (chemical vapor deposition) methods (such as thermal CVD, plasma CVD, and MOVPE), a sputtering method, hydride vapor phase epitaxy (HVPE), molecular beam epitaxy (MBE), a sublimation method, and pulsed laser deposition (PLD), with the sublimation method or HVPE being preferred. Examples of the liquid phase deposition method include solution growth methods (such as a flux method). Alternatively, the AlN single-crystal substrate can be obtained without directly forming an AlN single crystal on a seed substrate, by the steps of forming an unoriented precursor layer, forming the unoriented precursor layer into an AlN single-crystal layer by heat treatment, and grinding the seed substrate away. Examples of methods of forming the unoriented precursor layer in this case include an aerosol deposition (AD) method and a hypersonic plasma particle deposition (HPPD) method.

While any of the solid phase deposition method, vapor phase deposition method, and liquid phase deposition method described above may employ known conditions, a technique of fabricating the AlN single-crystal substrate using the sublimation method, for example, is hereinafter described. Specifically, the AlN single-crystal substrate is fabricated by (a) heat-treating polycrystalline AlN powder, (b) forming an AlN single-crystal layer, and (c) grinding a seed substrate away and polishing the surface of the AlN single-crystal layer.

(a) Heat-Treating Polycrystalline AlN Powder

This step is the step of heat-treating polycrystalline AlN powder to obtain AlN raw material powder. As shown in FIG. 1, AlN powder 12 is placed as an AlN single crystal raw material in a sheath 10 and heat-treated in a $N_2$ atmosphere. Here, graphite powder 14 and metal oxide (such as $Y_2O_3$, CaO, $CeO_2$, $Yb_2O_3$, or $Sm_2O_3$) powder 15 are placed in separate crucibles 16 and 17 in the sheath 10, avoiding direct contact with the AlN powder 12. The crucibles 16 and 17 have a size to be accommodated in the sheath 10. Here, by appropriately adjusting the graphite content and the metal oxide content, an AlN single-crystal substrate satisfying the above-described relation concerning transmittances, thermal conductivities, and electrical resistivity can be fabricated. The pressure in the furnace in the sheath 10 is preferably 0.1 to 10 atmospheres, and more preferably 0.5 to 5 atmospheres. The heat-treatment temperature is preferably 1900 to 2300° C., and more preferably 2000 to 2200° C. Preferred examples of materials forming the sheath and the crucibles include tantalum carbide, tungsten, molybdenum, and boron nitride (BN), with BN being preferred.

(b) Forming AlN Single-Crystal Layer

Figure 2:
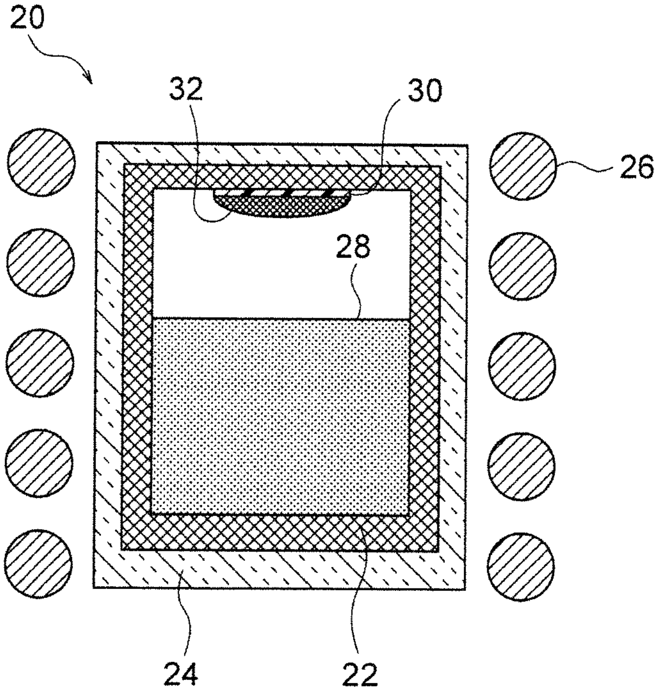
FIG. 2 is a schematic cross-sectional view showing the structure of a crystal growth apparatus used in a sublimation method.

This step is the step of forming an AlN single crystal on a seed substrate in a crystal growth apparatus. FIG. 2 shows one example of the crystal growth apparatus used in the sublimation method. A film formation apparatus 20 shown in FIG. 2 includes a crucible 22, a heat insulating material 24 for heat-insulating the crucible 22, and coils 26 for heating the crucible 22 to a high temperature. The crucible 22 contains AlN raw material powder 28 at a lower portion thereof and has a seed substrate 30 at an upper portion thereof, on which sublimated AlN raw material powder 28 is to be deposited. The crucible 22 is pressurized in an $N_2$ atmosphere, and the crucible 22 is heated with the coils 26 to sublimate the AlN raw material powder 28. The pressure is preferably 10 to 100 kPa, and more preferably 20 to 90 kPa. Here, a temperature gradient is generated such that the temperature near the seed substrate 30 at the upper portion of the crucible 22 is lower than the temperature near the AlN raw material powder 28 at the lower portion of the crucible 22. For example, a portion of the crucible 22 near the AlN raw material powder 28 is preferably heated to 1900 to 2250° C., and more preferably 2000 to 2200° C.; and a portion of the crucible 22 near the seed substrate 30 is preferably heated to 1400 to 2150° C., and more preferably 1500 to 2050° C. Here, the temperature of the portion near the seed substrate 30 is preferably lower by 100 to 500° C., more preferably 200 to 400° C., than the temperature near the AlN raw material powder 28. Such heating is preferably maintained for 2 to 100 hours, and more preferably 4 to 90 hours. The temperature can be controlled by measuring temperatures at the upper and lower portions of the crucible 22 with a radiation thermometer (not shown) through holes in the heat insulating material 24 covering the crucible 22, and feeding the results back to the temperature adjustment. In this manner, a SiC single crystal is placed as the seed substrate 30, and AlN is re-deposited on the surface of the seed substrate 30 to allow an AlN single-crystal layer 32 to be formed.

(c) Grinding Seed Substrate Away and Polishing Surface of AlN Single-Crystal Layer This step includes the grinding step of grinding the seed substrate away to expose the AlN single-crystal layer; and the polishing step of removing irregularities and defects on the surface of the AlN single crystal. The SiC single crystal remains on the AlN single-crystal layer fabricated by the steps (a) and (b) above using the SiC substrate as the seed substrate, and thus, the seed substrate is subjected to grinding to expose the surface of the AlN single-crystal layer. Additionally, to mirror-finish the surface of the formed AlN single-crystal layer, the plate surface is smoothed by lapping with diamond abrasive grains and then polished by chemical mechanical polishing (CMP) with colloidal silica or the like. In this manner, the AlN single-crystal substrate can be fabricated.

Device

A device can also be fabricated using the AlN single-crystal substrate of the present invention. That is, preferably, a device comprising the AlN single-crystal substrate is provided. Examples of such devices include deep ultraviolet laser diodes, deep ultraviolet diodes, power electronic devices, high-frequency devices, and heat sinks. Methods for manufacturing the device using the AlN single-crystal substrate are not specifically limited, and known techniques may be employed to manufacture the device.

EXAMPLES

The present invention is described in more detail with the following examples.

Examples 1 to 12

(1) Fabrication of AlN Single-Crystal Substrates (1a) Heat-Treating Polycrystalline AlN Powder As shown in FIG. 1, commercially available AlN powder 12 with an average particle diameter of 1 μm used as the AlN single crystal raw material was placed in the BN sheath 10. Commercially available graphite powder 14 with an average particle diameter of 1 μm was added to the BN crucible 16 in the proportions shown in Table 1, relative to 100 parts by weight of the AlN powder, while the metal oxide powder 15 was added to the BN crucible 17 in the proportions shown in Table 1, relative to 100 parts by weight of the AlN powder. As the metal oxide powder 15, yttrium oxide powder with an average particle diameter of 0.1 μm was used in Examples 1 to 6 and 10 to 12; cerium oxide powder with an average particle diameter of 1 μm was used in Example 7; ytterbium oxide powder with an average particle diameter of 1 μm was used in Example 8; and samarium oxide powder with an average particle diameter of 3 μm was used in Example 9. The BN crucibles 16 and 17 were placed in the BN sheath 10, avoiding direct contact with the AlN powder 12. The BN crucibles 16 and 17 had a size to be accommodated in the sheath 10. The BN sheath 10 was heat-treated in a graphite heater furnace at 2200° C. under 0.1 to 10 atmospheres in a $N_2$ atmosphere. In this manner, the polycrystalline AlN powder was heat-treated to prepare AlN raw material powder.

(1b) Forming AlN Single-Crystal Layer

As shown in FIG. 2, the crucible 22 was used as a crystal growth vessel, a SiC substrate was mounted as a substrate (seed substrate) 30 in this crucible, and the AlN raw material powder 28 prepared in (1a) above was added avoiding contact with the seed substrate 30. The crucible 22 was pressurized at 50 kPa in a $N_2$ atmosphere, the portion near the AlN raw material powder 28 in the crucible 22 was heated by high-frequency induction heating to 2100° C., while the portion near the SiC substrate 30 in the crucible 22 was heated to a lower temperature (lower by 200° C.) than that temperature, and the heating was maintained, thereby re-depositing the AlN single-crystal layer 32 on the SiC substrate 30. The heating was maintained for 10 hours.

(1c) Grinding SiC Substrate Away and Polishing Surface of AlN Single-Crystal Layer The SiC substrate having AlN re-deposited thereon, obtained in (1b) above, was ground using a grinding wheel of a size up to #2000, until the AlN single crystal was exposed, and the plate surface was further smoothed by lapping with diamond abrasive grains. Then, the plate surface was subjected to chemical mechanical polishing (CMP) with colloidal silica to be mirror-finished. In this manner, an AlN single-crystal substrate was fabricated.

(2) Evaluation of AlN Single-Crystal Substrate (2a) EBSD Measurement

Top and bottom surfaces of the AlN single-crystal substrate were subjected to EBSD measurement. The results showed that the AlN crystals were oriented in both the c- and a-axis directions.

(2b) Transmission Spectrum

The total light transmittance $T_a$ in the wavelength range of 200 to 800 nm was measured for the AlN single-crystal substrate, using a spectrophotometer (UH4150 manufactured by Hitachi High-Tech Corporation). The absorption coefficient α of the AlN single-crystal substrate was determined using the measured value of $T_a$ and theoretical transmittance $T_t$ of the AlN single-crystal substrate, and then the transmittance $T_{100\ \mu m}$ with the thickness of the AlN single-crystal substrate converted to 100 μm was calculated. α and $T_{100\ \mu m}$ were determined according to the following equations:

$$\alpha = -1/t \times \ln(T_a/T_t);\ \text{and}$$

$$T_{100\,\mu m} = \exp(-\alpha/100)$$

wherein t represents an actual thickness (cm) of an AlN single-crystal sample. In this manner, a transmission spectrum based on the transmittance $T_{100\ \mu m}$ with the thickness converted to 100 μm was obtained. Based on the obtained transmission spectrum, the difference between $T_{640\text{-}660}$ and $T_{260\text{-}280}$ ($T_{640\text{-}660}-T_{260\text{-}280}$) (% pt) was calculated, wherein $T_{640\text{-}660}$ is an average value of transmittance (%) at 640 to 660 nm, and $T_{260\text{-}280}$ is an average value of transmittance (%) at 260 to 280 nm. The results are shown in Table 1.

(2c) Thermal Conductivities

The thermal conductivity $\lambda_{25}$ at 25° C. and thermal conductivity $\lambda_{200}$ at 200° C. of the AlN single-crystal substrate were determined according to the equation: (thermal conductivity)=(thermal diffusivity)×(specific heat)×(density). Here, the thermal diffusivity was measured at 25 and 200° C. for AlN single-crystal samples processed into a disc shape with a diameter of 10 mm and a thickness of 0.4 mm, using a flash analyzer thermal diffusivity measuring apparatus (LFA467HT manufactured by NETSCH). The specific heat was measured at 25 and 200° C. for AlN single-crystal samples processed into a disc shape with a diameter of 5 mm and a thickness of 0.4 mm, using a differential scanning calorimeter (DSC404 manufactured by NETSCH). The density was measured by the Archimedes' method in accordance with JIS R 1634:1998. The difference between the thermal conductivity $\lambda_{25}$ at 25° C. and the thermal conductivity $\lambda_{200}$ at 200° C. ($\lambda_{25}-\lambda_{200}$) (W/m·K) was calculated. The results are shown in Table 1.

(2d) Electrical Resistivity

Ohmic electrodes were formed on top and bottom surfaces of the AlN single-crystal substrate, and the electrical resistivity at 25° C. was measured by the two-terminal method. The results are shown in Table 1.

(2e) Calculation of Relation

Based on the numerical values obtained in (2b) to (2d) above, a value obtained from the relation: $[(\lambda_{25}-\lambda_{200})\times \log_{10}\rho]/(T_{640\text{-}660}-T_{260\text{-}280})$ was calculated. The results are shown in Table 1.

(2f) Examination of Cracks

The surface of the AlN single-crystal substrate after grinding and polishing in (1c) above was observed with an optical microscope to examine for cracks with a maximum length of 50 μm or more. A total of 10 AlN single-crystal substrates were fabricated using the same method as described in (1) above, and it was examined how many of these AlN single-crystal substrates cracked, and then the AlN single-crystal substrates were rated according to the evaluation criteria shown below. The results are shown in Table 1.

<Evaluation Criteria>

Rating A: Nine or ten AlN single-crystal substrates were free of cracks

Rating B: Six to eight AlN single-crystal substrates were free of cracks

Rating C: Three to five AlN single-crystal substrates were free of cracks

Rating D: All of the AlN single-crystal substrates showed cracks

TABLE 1

| | Amount of graphite powder added relative to 100 parts by weight of AlN powder (part(s) by weight) | Amount of metal oxide powder added relative to 100 parts by weight of AlN powder (part(s) by weight) | Composition of metal oxide powder | $T_{640-660}$ − $T_{260-280}$ (% pt) | $\lambda_{25}$ − $\lambda_{200}$ (W/m · K) | ρ (Ω · cm) | Value obtained from relation | Examination of cracks |
|---|---|---|---|---|---|---|---|---|
| Ex. 1 | 6 | 8 | $Y_2O_3$ | 65 | 72 | $6 \times 10^5$ | 6 | A |
| Ex. 2 | 6 | 4 | $Y_2O_3$ | 65 | 72 | $2 \times 10^{10}$ | 11 | A |
| Ex. 3 | 6 | 2 | $Y_2O_3$ | 65 | 72 | $2 \times 10^{15}$ | 17 | A |
| Ex. 4 | 4 | 4 | $Y_2O_3$ | 30 | 60 | $2 \times 10^{10}$ | 21 | B |
| Ex. 5 | 3 | 1 | $Y_2O_3$ | 30 | 89 | $2 \times 10^{15}$ | 45 | C |
| Ex. 6 | 3 | 4 | $Y_2O_3$ | 10 | 40 | $2 \times 10^{10}$ | 41 | C |
| Ex. 7 | 6 | 8 | $CeO_2$ | 65 | 72 | $6 \times 10^5$ | 6 | B |
| Ex. 8 | 6 | 8 | $Yb_2O_3$ | 65 | 72 | $6 \times 10^5$ | 6 | B |
| Ex. 9 | 6 | 8 | $Sm_2O_3$ | 65 | 72 | $6 \times 10^5$ | 6 | B |
| Ex. 10* | 0 | 0 | $Y_2O_3$ | 7 | 89 | $2 \times 10^{15}$ | 195 | D |
| Ex. 11* | 2 | 0 | $Y_2O_3$ | 13 | 72 | $2 \times 10^{15}$ | 85 | D |
| Ex. 12* | 10 | 60 | $Y_2O_3$ | 65 | 30 | $2 \times 10^6$ | 3 | D |

*indicates comparative examples.

What is claimed is:

1. An AlN single-crystal substrate, which satisfies a relation:

$$5 \leq [(\lambda_{25} - \lambda_{200}) \times \log_{10}\rho] / (T_{640-660} - T_{260-280}) \leq 50$$

wherein $\lambda_{25}$ is a thermal conductivity (W/m·K) at 25° C. of the AlN single-crystal substrate; $\lambda_{200}$ is a thermal conductivity (W/m·K) at 200° C. of the AlN single-crystal substrate; ρ is an electrical resistivity (Ω·cm) at 25° C. of the AlN single-crystal substrate; $T_{640-660}$ is an average value of transmittance (%) at 640 to 660 nm in a transmission spectrum of the AlN single-crystal substrate; and $T_{260-280}$ is an average value of transmittance (%) at 260 to 280 nm in the transmission spectrum.

2. The AlN single-crystal substrate according to claim 1, which satisfies a relation:

$$5 \leq [(\lambda_{25} - \lambda_{200}) \times \log_{10}\rho] / (T_{640-660} - T_{260-280}) \leq 20.$$

3. The AlN single-crystal substrate according to claim 1, wherein a difference between $T_{640-660}$ and $T_{260-280}$ ($T_{640-660}$−$T_{260-280}$) is 30 to 70 percent points (% pt).

4. The AlN single-crystal substrate according to claim 1, wherein a difference between $\lambda_{25}$ and $\lambda_{200}$ ($\lambda_{25}$−$\lambda_{200}$) is 70 to 80 W/m·K.

5. The AlN single-crystal substrate according to claim 1, wherein ρ is $1\times10^4$ to $1\times10^6$ Ω·cm.

6. A device comprising the AlN single-crystal substrate according to claim 1.

* * * * *